United States Patent
Ogawa et al.

(10) Patent No.: US 7,576,523 B2
(45) Date of Patent: Aug. 18, 2009

(54) POWER SUPPLY CIRCUIT AND SEMICONDUCTOR MEMORY

(75) Inventors: Mikio Ogawa, Yokohama (JP); Yasuhiro Suematsu, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/125,589

(22) Filed: May 22, 2008

(65) Prior Publication Data

US 2008/0290852 A1 Nov. 27, 2008

(30) Foreign Application Priority Data

May 23, 2007 (JP) ............... 2007-136443

(51) Int. Cl.
*G05F 1/40* (2006.01)
*H02M 3/18* (2006.01)
*G11C 7/00* (2006.01)

(52) U.S. Cl. .......... 323/274; 323/284; 363/60; 327/536; 365/226

(58) Field of Classification Search ............ 323/272, 323/274, 275, 281, 283, 284, 285, 288; 363/59, 363/60; 327/530, 536, 537; 365/226, 227
See application file for complete search history.

(56) References Cited

U.S. PATENT DOCUMENTS

| | | | | |
|---|---|---|---|---|
| 6,122,185 | A * | 9/2000 | Utsunomiya et al. | 363/60 |
| 6,525,949 | B1 | 2/2003 | Johnson et al. | |
| 6,853,566 | B2 * | 2/2005 | Itoh | 363/60 |
| 7,042,275 | B2 * | 5/2006 | Suwa et al. | 363/60 |
| 7,123,067 | B2 | 10/2006 | Yasui et al. | |
| 2008/0116963 | A1 * | 5/2008 | Jung | 327/537 |
| 2008/0137428 | A1 * | 6/2008 | Nakai et al. | 327/530 |

* cited by examiner

*Primary Examiner*—Jessica Han
(74) *Attorney, Agent, or Firm*—Oblon, Spivak, McClelland, Maier & Neustadt, P.C.

(57) ABSTRACT

A power supply circuit that outputs a set voltage from an output terminal, has a boosting circuit that boosts a voltage supplied from a power supply and outputs the voltage to the output terminal; a voltage detecting circuit that outputs a first detecting signal when the voltage outputted from the boosting circuit is not lower than a first detection voltage set lower than the set voltage, and outputs a second detecting signal when the voltage outputted from the boosting circuit is not lower than the set voltage; and a clock signal generating circuit that outputs, based on a reference clock signal, a clock signal and an inverted clock signal obtained by inverting the clock signal, and stops outputs of the clock signal and the inverted clock signal in response to the second detecting signal.

16 Claims, 8 Drawing Sheets

POWER SUPPLY CIRCUIT AND SEMICONDUCTOR MEMORY

CROSS-REFERENCE TO RELATED APPLICATION

This application is based upon and claims the benefit of priority from the prior Japanese Patent Application No. 2007-136443, filed on May 23, 2007, the entire contents of which are incorporated herein by reference.

BACKGROUND OF THE INVENTION

1. Field of the Invention

The present invention relates to a power supply circuit including a boosting circuit for boosting a power supply voltage.

2. Background Art

In NAND electrically erasable programmable read-only memories (EEPROMs) including NAND flash memories, high voltages are used for operations such as writing, erasing, and reading. Such high voltages are generated by boosting circuits.

In recent years, high voltage levels have been demanded for multivalued NAND EEPROMs.

Generally, boosting circuits configured to guarantee high set voltages increase fluctuations in output voltage at low set voltages.

In NAND EEPROMs, it is necessary to generate lower set voltages in the same boosting circuits. Conventionally, it has been difficult to achieve both high boosting capability and smaller fluctuations in output voltage at a low set voltage level.

Actually, the size of a boosting circuit (e.g., the size of a capacitor composing the boosting circuit) is determined by the rising speed of a voltage.

As the set voltage increases, it is necessary to increase the size and boosting capability of the boosting circuit because a voltage has to be increased within a predetermined time. The raised voltage increases the boosting capability and thus causes large fluctuations in output voltage.

When the boosting capability is thus increased, fluctuations in output voltage further increase with a reduction in set voltage.

As described above, it is difficult to achieve both a higher rising speed of an output voltage (high boosting capability) and smaller fluctuations in output voltage.

In a conventional power supply circuit, a power supply voltage is detected by a potential detecting circuit, the detected voltage and an output voltage level-shifted by predetermined levels by a level shifter are compared with each other by a comparator, and the amplitude of a voltage (clock signal) inputted to the gate of the MOS transistor in the first stage of a clock driving boosting section is controlled based on the comparison output (for example, see Japanese Patent No. 3596130).

The configuration of the conventional power supply circuit reduces fluctuations in output voltage according to the power supply voltage when the power supply voltage fluctuates.

However, the conventional power supply circuit does not reduce fluctuations in output voltage while increasing the rising speed of an output voltage.

SUMMARY OF THE INVENTION

According to one aspect of the present invention, there is provided: a power supply circuit that outputs a set voltage from an output terminal, comprising:

a boosting circuit that boosts a voltage supplied from a power supply and outputs the voltage to the output terminal;

a voltage detecting circuit that outputs a first detecting signal when the voltage outputted from the boosting circuit is not lower than a first detection voltage set lower than the set voltage, and outputs a second detecting signal when the voltage outputted from the boosting circuit is not lower than the set voltage; and a clock signal generating circuit that outputs, based on a reference clock signal, a clock signal and an inverted clock signal obtained by inverting the clock signal, and stops outputs of the clock signal and the inverted clock signal in response to the second detecting signal, the boosting circuit comprising:

a first MOS transistor of a first conductivity type having one end connected to the power supply and a gate fed with the clock signal;

a first capacitor having one end connected to an other end of the first MOS transistor;

a first logic circuit fed with the inverted clock signal and a limit signal generated based on the first detecting signal to limit a boosting capability, outputting the inverted clock signal to an other end of the first capacitor, and limiting the output of the inverted clock signal in response to the limit signal;

a second MOS transistor of a second conductivity type having one end connected to the one end of the first capacitor and a gate fed with the clock signal;

a third MOS transistor of the first conductivity type having one end connected to an other end of the second MOS transistor, an other end connected to ground, and a gate connected to the gate of the second MOS transistor;

a fourth MOS transistor of the first conductivity type having one end connected to the power supply and a gate fed with the inverted clock signal;

a second capacitor having one end connected to an other end of the fourth MOS transistor;

a second logic circuit fed with the limit signal and the clock signal, outputting the clock signal to an other end of the second capacitor, and limiting the output of the clock signal in response to the limit signal;

a fifth MOS transistor of the second conductivity type having one end connected to the one end of the second capacitor and a gate fed with the inverted clock signal;

a sixth MOS transistor of the first conductivity type having one end connected to an other end of the fifth MOS transistor, an other end connected to the ground, and a gate connected to the gate of the fifth MOS transistor;

a first diode having an anode connected to the one end of the second MOS transistor;

a second diode having an anode connected to a cathode of the first diode and a cathode connected to the output terminal;

a third diode having an anode connected to the one end of the fifth MOS transistor;

a fourth diode having an anode connected to a cathode of the third diode and a cathode connected to the output terminal;

a third capacitor having one end connected to the other end of the second MOS transistor and an other end connected to the cathode of the third diode; and a fourth capacitor having one end connected to the other end of the fifth MOS transistor and an other end connected to the cathode of the first diode.

According to the other aspect of the present invention, there is provided: a power supply circuit that outputs a set voltage from an output terminal, comprising:

a boosting circuit that boosts a voltage supplied from a power supply and outputs the voltage to the output terminal;

a voltage detecting circuit that outputs a first detecting signal when the voltage outputted from the boosting circuit is not lower than a first detection voltage set lower than the set voltage, and outputs a second detecting signal when the voltage outputted from the boosting circuit is not lower than the set voltage; and a clock signal generating circuit that outputs, based on a reference clock signal, a clock signal and an inverted clock signal obtained by inverting the clock signal, and stops outputs of the clock signal and the inverted clock signal in response to the second detecting signal, the boosting circuit comprising:

a first MOS transistor of a first conductivity type having one end connected to the power supply and a gate fed with the clock signal;

a first capacitor having one end connected to an other end of the first MOS transistor;

a first logic circuit fed with the inverted clock signal and a limit signal generated based on the first detecting signal to limit a boosting capability, outputting the inverted clock signal to an other end of the first capacitor, and limiting the output of the inverted clock signal in response to the limit signal;

a second MOS transistor of a second conductivity type having one end connected to the one end of the first capacitor and a gate fed with the clock signal;

a third MOS transistor of the first conductivity type having one end connected to an other end of the second MOS transistor, an other end connected to ground, and a gate connected to the gate of the second MOS transistor;

a fourth MOS transistor of the first conductivity type having one end connected to the power supply and a gate fed with the inverted clock signal;

a second capacitor having one end connected to an other end of the fourth MOS transistor;

a second logic circuit fed with the limit signal and the clock signal, outputting the clock signal to an other end of the second capacitor, and limiting the output of the clock signal in response to the limit signal;

a fifth MOS transistor of the second conductivity type having one end connected to the one end of the second capacitor and a gate fed with the inverted clock signal;

a sixth MOS transistor of the first conductivity type having one end connected to an other end of the fifth MOS transistor, an other end connected to the ground, and a gate connected to the gate of the fifth MOS transistor;

a seventh MOS transistor of the first conductivity type having one end connected to the power supply and a gate fed with the clock signal;

a third capacitor having one end connected to the other end of the seventh MOS transistor and an other end fed with the inverted clock signal;

a first diode having an anode connected to the other end of the seventh MOS transistor;

a second diode having an anode connected to a cathode of the first diode and a cathode connected to the output terminal;

an eighth MOS transistor of the first conductivity type having one end connected to the power supply and a gate fed with the inverted clock signal;

a fourth capacitor having one end connected to the other end of the eighth MOS transistor and an other end fed with the clock signal;

a third diode having an anode connected to the other end of the eighth MOS transistor;

a fourth diode having an anode connected to a cathode of the third diode and a cathode connected to the output terminal;

a fifth capacitor having one end connected to the other end of the second MOS transistor and an other end connected to the cathode of the third diode; and a sixth capacitor having one end connected to the other end of the fifth MOS transistor and an other end connected to the cathode of the first diode.

According to further aspect of the present invention, there is provided: a semiconductor memory comprising a power supply circuit that outputs a set voltage from an output terminal, the power supply circuit comprising:

a boosting circuit that boosts a voltage supplied from a power supply and outputs the voltage to the output terminal;

a voltage detecting circuit that outputs a first detecting signal when the voltage outputted from the boosting circuit is not lower than a first detection voltage set lower than the set voltage, and outputs a second detecting signal when the voltage outputted from the boosting circuit is not lower than the set voltage; and a clock signal generating circuit that outputs, based on a reference clock signal, a clock signal and an inverted clock signal obtained by inverting the clock signal, and stops outputs of the clock signal and the inverted clock signal in response to the second detecting signal, the boosting circuit comprising:

a first MOS transistor of a first conductivity type having one end connected to the power supply and a gate fed with the clock signal;

a first capacitor having one end connected to an other end of the first MOS transistor;

a first logic circuit fed with the inverted clock signal and a limit signal generated based on the first detecting signal to limit a boosting capability, outputting the inverted clock signal to an other end of the first capacitor, and limiting the output of the inverted clock signal in response to the limit signal;

a second MOS transistor of a second conductivity type having one end connected to the one end of the first capacitor and a gate fed with the clock signal;

a third MOS transistor of the first conductivity type having one end connected to an other end of the second MOS transistor, an other end connected to ground, and a gate connected to the gate of the second MOS transistor;

a fourth MOS transistor of the first conductivity type having one end connected to the power supply and a gate fed with the inverted clock signal;

a second capacitor having one end connected to an other end of the fourth MOS transistor;

a second logic circuit fed with the limit signal and the clock signal, outputting the clock signal to an other end of the second capacitor, and limiting the output of the clock signal in response to the limit signal;

a fifth MOS transistor of the second conductivity type having one end connected to the one end of the second capacitor and a gate fed with the inverted clock signal;

a sixth MOS transistor of the first conductivity type having one end connected to an other end of the fifth MOS transistor, an other end connected to the ground, and a gate connected to the gate of the fifth MOS transistor;

a first diode having an anode connected to the one end of the second MOS transistor;

a second diode having an anode connected to a cathode of the first diode and a cathode connected to the output terminal;

a third diode having an anode connected to the one end of the fifth MOS transistor;

a fourth diode having an anode connected to a cathode of the third diode and a cathode connected to the output terminal;

a third capacitor having one end connected to the other end of the second MOS transistor and an other end connected to the cathode of the third diode; and a fourth capacitor having one end connected to the other end of the fifth MOS transistor and an other end connected to the cathode of the first diode.

DETAILED DESCRIPTION

Exemplary embodiments of the present invention will be described below in accordance with the accompanying drawings. In the following embodiments, diodes are provided in two stages. The number of diodes may be increased with a necessary boosting voltage.

FIRST EMBODIMENT

Figure 1:
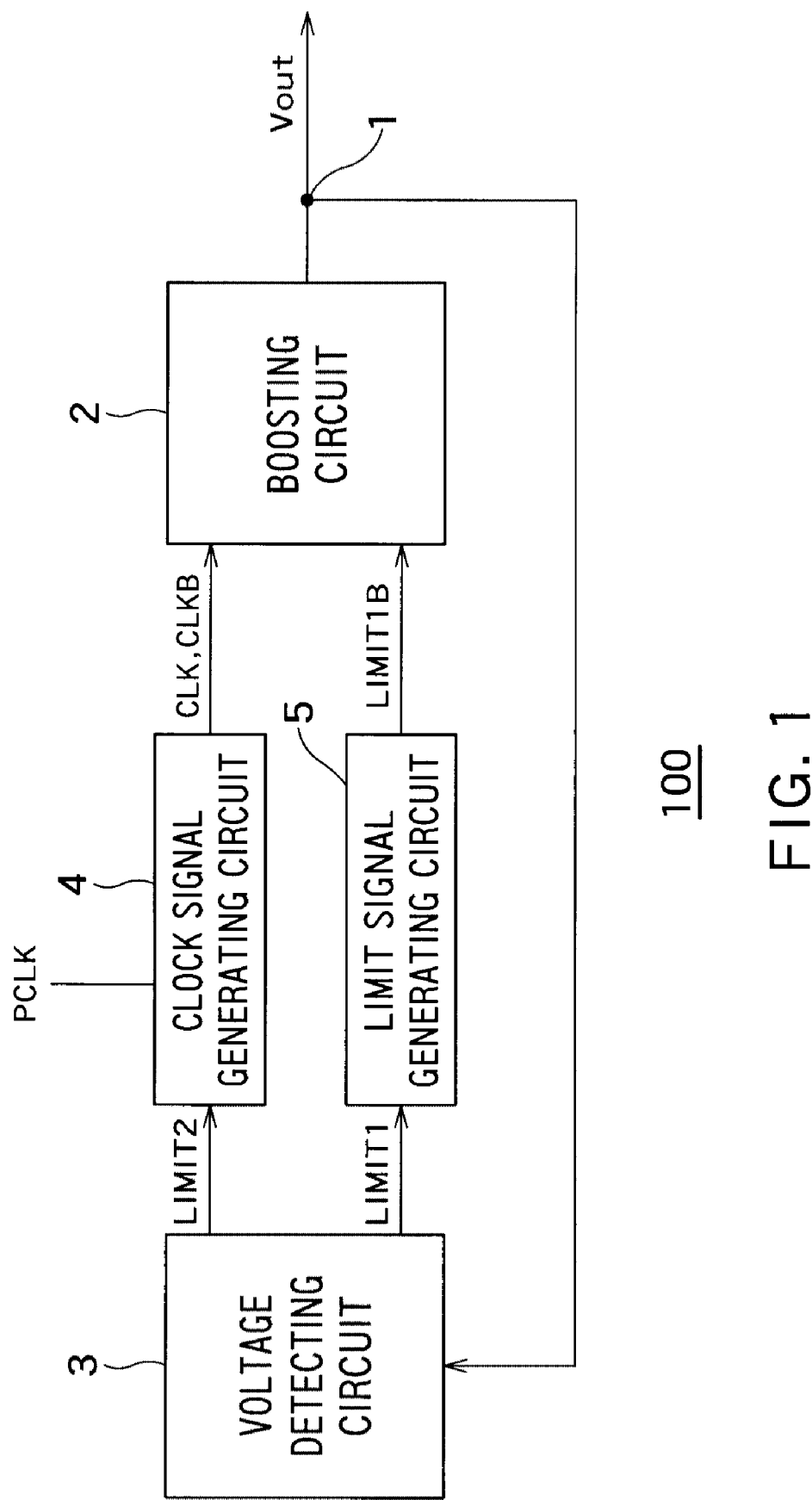
FIG. 1 shows the configuration of the main part of a power supply circuit 100 according to a first embodiment which is an aspect of the present invention.
Figure 2:
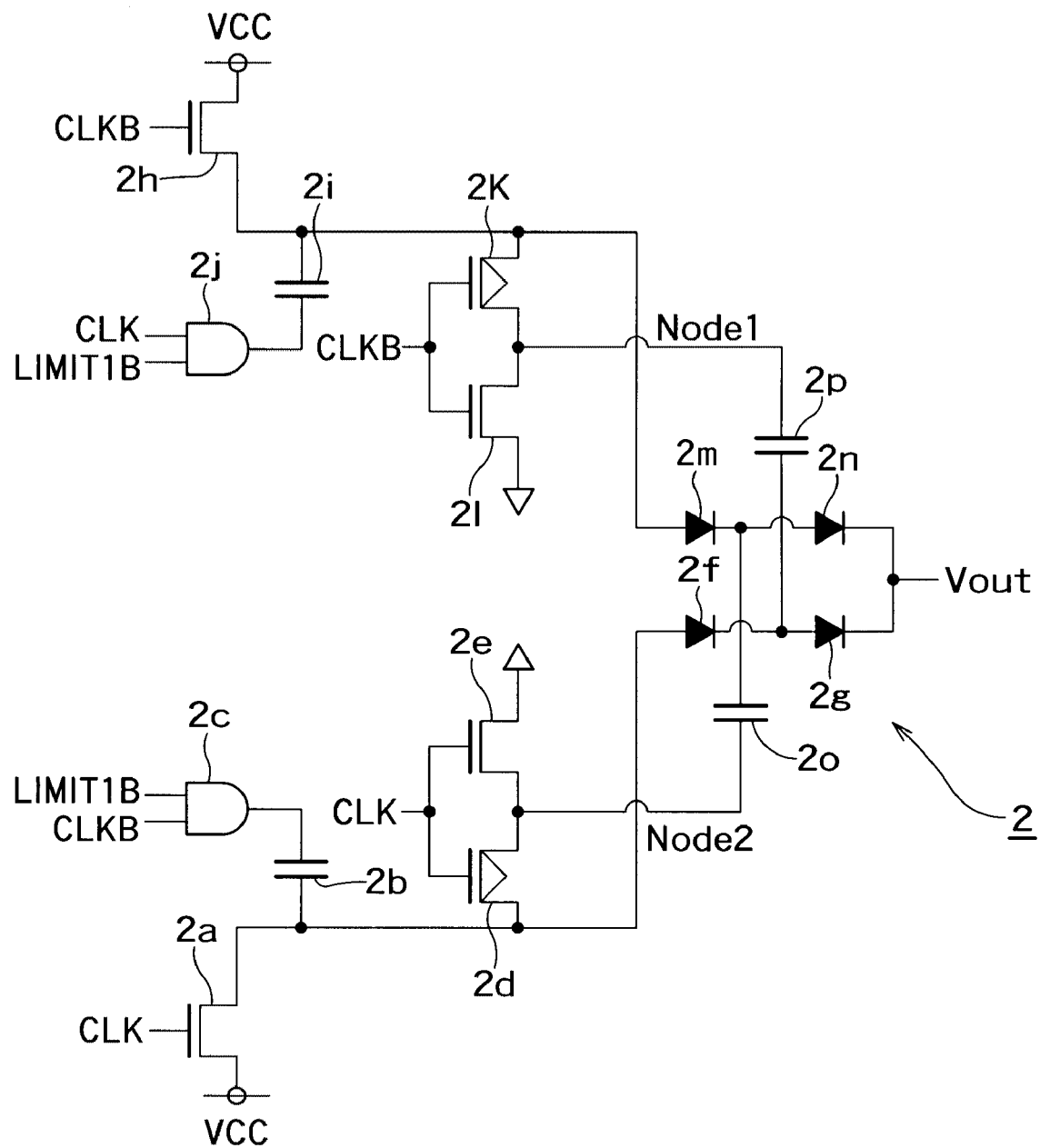
FIG. 2 shows an example of a boosting circuit applied to the power supply circuit of FIG. 1.
Figure 3:
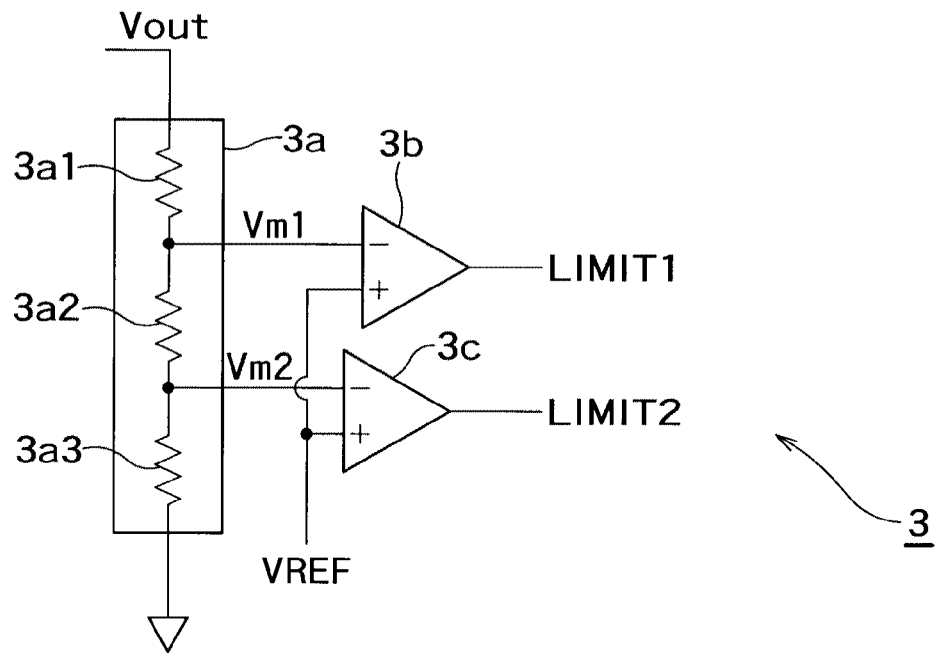
FIG. 3 shows an example of a voltage detecting circuit applied to the power supply circuit of FIG. 1.
Figure 4:
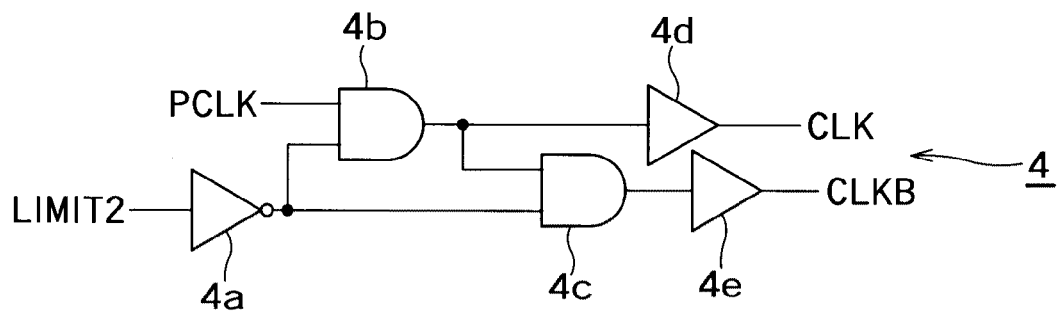
FIG. 4 shows an example of a clock signal generating circuit applied to the power supply circuit of FIG. 1.
Figure 5:
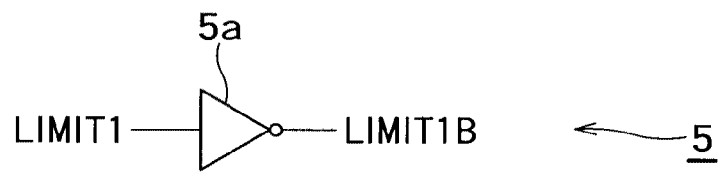
FIG. 5 shows an example of limit signal generating circuit applied to the power supply circuit of FIG. 1.

FIG. 1 shows the configuration of the main part of a power supply circuit 100 according to a first embodiment which is an aspect of the present invention. FIG. 2 shows an example of a boosting circuit applied to the power supply circuit of FIG. 1. FIG. 3 shows an example of a voltage detecting circuit applied to the power supply circuit of FIG. 1. FIG. 4 shows an example of a clock signal generating circuit applied to the power supply circuit of FIG. 1. FIG. 5 shows an example of limit signal generating circuit applied to the power supply circuit of FIG. 1.

In the present embodiment, a MOS transistor of a first conductivity type is used as an nMOS transistor and a MOS transistor of a second conductivity type is used as a pMOS transistor. By changing the polarity of the circuit, the MOS transistor of the first conductivity type may be used as a pMOS transistor and the MOS transistor of the second conductivity type may be used as an nMOS transistor.

As shown in FIG. 1, the power supply circuit 100 controls an output voltage Vout from an output terminal 1 to a set voltage Vset and outputs the voltage.

The power supply circuit 100 includes a boosting circuit 2 which boosts a voltage supplied from a power supply and outputs the voltage to the output terminal 1, and a voltage detecting circuit 3 which detects the voltage Vout outputted from the boosting circuit 2, outputs a first detecting signal LIMIT1 for controlling the boosting capability of the boosting circuit 2 according to the detected voltage, and outputs a second detecting signal LIMIT2 for controlling the activation of the boosting circuit 2.

Further, the power supply circuit 100 includes a clock signal generating circuit 4 which outputs, based on a reference clock signal PCLK, a clock signal CLK and an inverted clock signal CLKB obtained by inverting the clock signal, and stops the outputs of the clock signal CLK and the inverted clock signal CLKB in response to the second detecting signal LIMIT2, and a limit signal generating circuit 5 for outputting a limit signal LIMIT1B which is generated based on the first detecting signal LIMIT1 to limit the boosting capability.

As shown in FIG. 2, the boosting circuit 2 includes a first MOS transistor 2a of the first conductivity type (n type) which has one end (drain) connected to a power supply VCC and the gate fed with the clock signal CLK, and a first capacitor 2b having one end connected to the other end (source) of the first MOS transistor 2a.

Further, the boosting circuit 2 includes a first AND circuit 2c acting as a first logic circuit which is fed with the limit signal LIMIT1B and the inverted clock signal CLKB, has the output connected to the other end of the first capacitor 2b, outputs the inverted clock signal CLKB to the other end of the first capacitor 2b, and limits the output of the inverted clock signal CLKB in response to the limit signal LIMIT1B.

For example, when the limit signal LIMIT1B is a "High" level signal, that is, in a logic "1" state, the first AND circuit 2c outputs the inputted inverted clock signal CLKB. On the other hand, when the limit signal LIMIT1B is a "Low" level signal, that is, in a logic "0" state, the first AND circuit 2c stops the output of the inverted clock signal CLKB and outputs a "Low" level signal (a signal at the ground potential).

Further, the boosting circuit 2 includes a second MOS transistor 2d of the second conductivity type (p type) which has one end (source) connected to the one end of the first capacitor 2b and the gate fed with the clock signal CLK, and a third MOS transistor 2e of the first conductivity type which has one end (drain) connected to the other end of the second MOS transistor 2d, the other end (source) connected to the ground, and the gate connected to the gate of the second MOS transistor 2d.

Moreover, the boosting circuit 2 includes a first diode 2f having the anode connected to the one end (source) of the second MOS transistor 2d, and a second diode 2g having the anode connected to the cathode of the first diode 2f and the cathode connected to the output terminal 1.

Further, the boosting circuit 2 includes a fourth MOS transistor 2h of the first conductivity type which has one end (drain) connected to the power supply VCC and the gate fed with the inverted clock signal CLKB, and a second capacitor 2i having one end connected to the other end (source) of the fourth MOS transistor 2h.

Moreover, the boosting circuit 2 includes a second AND circuit 2j acting as a second logic circuit which is fed with the limit signal LIMIT1B and the clock signal CLK, has the output connected to the other end of the second capacitor 2i, outputs the clock signal CLK to the other end of the second capacitor 2i, and limits the output of the clock signal CLK in response to the limit signal LIMIT1B.

For example, when the limit signal LIMIT1B is a "High" level signal, that is, in the logic "1" state, the second AND circuit 2j outputs the inputted clock signal CLK. On the other hand, when the limit signal LIMIT1B is a "Low" level signal, that is, in the logic "0" state, the second AND circuit 2j stops the output of the clock signal CLK and outputs a "Low" level signal (a signal at the ground potential).

Further, the boosting circuit 2 includes a fifth MOS transistor 2k of the second conductivity type which has one end (source) connected to the one end of the second capacitor 2i and the gate fed with the inverted clock signal CLKB, and a sixth MOS transistor 2l of the first conductivity type which has one end (drain) connected to the other end (drain) of the fifth MOS transistor 2k, the other end (source) connected to the ground, and the gate connected to the gate of the fifth MOS transistor 2k.

Moreover, the boosting circuit 2 includes a third diode 2m having the anode connected to the one end (source) of the fifth MOS transistor 2k, and a fourth diode 2n having the anode connected to the cathode of the third diode 2m and the cathode connected to the output terminal 1.

Further, the boosting circuit 2 includes a third capacitor 2o having one end connected to the other end (drain) of the second MOS transistor 2d and the other end connected to the cathode of the third diode 2m, and a fourth capacitor 2p having one end connected to the other end (drain) of the fifth MOS transistor 2k and the other end connected to the cathode of the first diode 2f.

The other end (drain) of the second MOS transistor 2d will be referred to as Node2 and the other end (drain) of the fifth MOS transistor 2k will be referred to as Node1.

When the voltage Vout outputted from the boosting circuit 2 is not lower than a first detection voltage V1 set lower than the set voltage Vset, the voltage detecting circuit 3 outputs the first detecting signal LIMIT1. When the voltage Vout outputted from the boosting circuit 2 is not lower than the set voltage Vset, the voltage detecting circuit 3 outputs the second detecting signal LIMIT2.

As shown in FIG. 3, the voltage detecting circuit 3 includes, for example, a voltage dividing circuit 3a, a first comparator amplifier 3b, and a second comparator amplifier 3c.

The voltage dividing circuit 3a includes a first resistor 3a1 which has one end connected to the output terminal 1 and has a resistance value R1, a second resistor 3a2 which has one end connected to the other end of the first resistor 3a1 and has a resistance value R2, and a third resistor 3a3 which has one end connected to the other end of the second resistor 3a2 and the other end connected to the ground, and has a resistance value R3.

With this configuration, the voltage dividing circuit 3a divides the voltage Vout outputted from the boosting circuit 2 at a first voltage dividing ratio (R2+R3)/(R1+R2+R3) and outputs a first monitor voltage Vm1. Further, the voltage dividing circuit 3a divides the voltage Vout outputted from the boosting circuit 2 at a second voltage dividing ratio (R3)/(R1+R2+R3) which is smaller than the first voltage dividing ratio (R2+R3)/(R1+R2+R3), and outputs a second monitor voltage Vm2.

The first comparator amplifier 3b compares a reference voltage VREF and the first monitor voltage Vm1, and outputs the first detecting signal LIMIT1 (in this case, a "High" level signal, that is, a logic "1") when the first monitor voltage Vm1 is higher than the reference voltage VREF.

Further, the first comparator amplifier 3b compares the reference voltage VREF and the first monitor voltage Vm1 and outputs a "Low" level signal, that is, a logic "0" when the first monitor voltage Vm1 is lower than the reference voltage VREF.

The second comparator amplifier 3c compares the reference voltage VREF and the second monitor voltage Vm2 and outputs the second detecting signal LIMIT2 (in this case, a "High" level signal, that is, the logic "1") when the second monitor voltage Vm2 is higher than the reference voltage VREF.

Further, the second comparator amplifier 3c compares the reference voltage VREF and the second monitor voltage Vm2 and outputs a "Low" level signal, that is, the logic "0" when the second monitor voltage Vm2 is lower than the reference voltage VREF.

As shown in FIG. 4, the clock signal generating circuit 4 includes, for example, a first inverter 4a fed with the second detecting signal LIMIT2, a third AND circuit 4b fed with the reference clock signal PCLK and the output signal of the first inverter 4a, and a fourth AND circuit 4c fed with the output signal of the third AND circuit 4b and the output signal of the first inverter 4a.

Further, the clock signal generating circuit 4 includes a first buffer 4d which is fed with the output signal of the third AND circuit 4d and outputs the clock signal CLK, and a second buffer 4e which is fed with the output signal of the fourth AND circuit 4c and outputs the inverted clock signal CLKB.

With this configuration, when the clock signal generating circuit 4 is not fed with the second detecting signal LIMIT2 but fed with the "Low" level signal, that is, the logic "0", the clock signal generating circuit 4 outputs the clock signal CLK and the inverted clock signal CLKB obtained by inverting the clock signal, based on the reference clock signal PCLK. Moreover, the clock signal generating circuit 4 stops the outputs of the clock signal CLK and the inverted clock signal CLKB in response to the second detecting signal LIMIT2 (in other words, when fed with the second detecting signal LIMIT2 (a "High" level signal, that is, the logic "1")).

As shown in FIG. 5, the limit signal generating circuit 5 includes, for example, a second inverter 5a which is fed with the output signal (the first detecting signal LIMIT1) of the first comparator amplifier 3b and outputs, as the limit signal LIMIT1B, a signal obtained by inverting the output signal of the first comparator amplifier 3b.

With this configuration, the limit signal generating circuit 5 generates the limit signal LIMIT1B for limiting the boosting capability based on the first detecting signal LIMIT1.

The following will discuss the boosting operation of the power supply circuit 100 configured thus.

Figure 6:
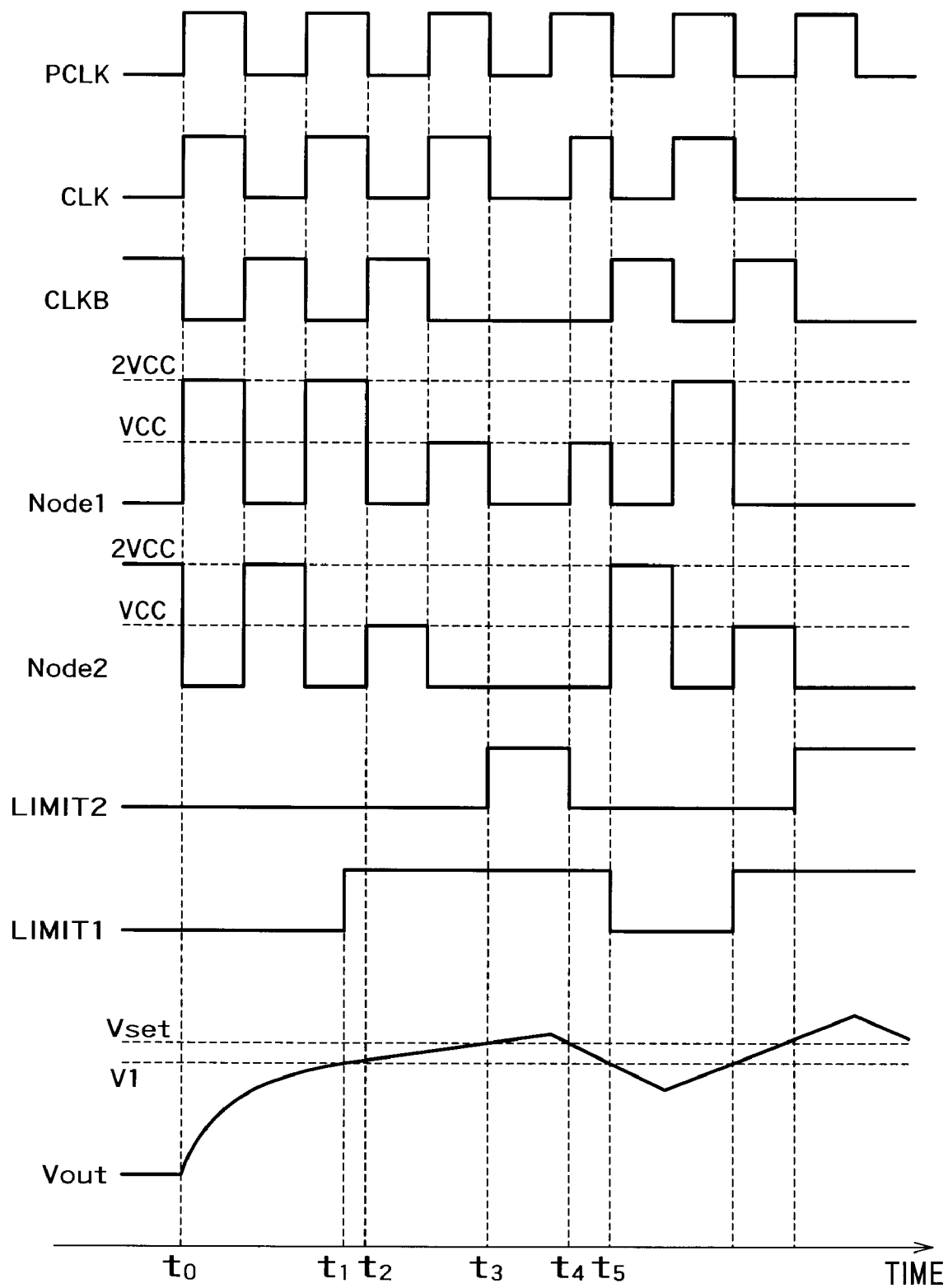
FIG. 6 shows the relationship between the output of the power supply circuit and the timing waveforms of the signals for controlling the boosting operation of the power supply circuit according to the first embodiment.

FIG. 6 shows the relationship between the output of the power supply circuit and the timing waveforms of the signals for controlling the boosting operation of the power supply circuit according to the first embodiment of the present invention.

As shown in FIG. 6, first, the boosting operation is started at time t0. At this time, the output voltage Vout is lower than the first detection voltage V1. Thus the first detecting signal LIMIT1 ("High" level signal) is not outputted from the voltage detecting circuit 3 and a limit signal LIMIT is at a "High" level.

Therefore, in the boosting circuit 2, the inverted clock signal CLKB and the clock signal CLK are outputted from the first and second AND circuits 2c and 2j, respectively. Further, a voltage VCC is supplied from the first and fourth MOS transistors 2a and 2h to the first and second capacitors 2b and 2i. Thus, for example, the voltage VCC is charged in the first and second capacitors 2b and 2i (FIG. 2).

Thus, at Node1 and Node2 of the boosting circuit 2, a voltage signal having an amplitude of 2VCC is outputted in response to the clock signal CLK and the inverted clock signal CLKB. Therefore, a voltage charged in the third and fourth capacitors 2o and 2p increases. In other words, the boosting circuit 2 has high boosting capability with a high boosting speed.

Next, at time t1, the output voltage Vout reaches the first detection voltage V1 or higher and the first detecting signal LIMIT1 ("High" level signal) is outputted. Thus the limit signal LIMIT is set at a "Low" level.

Therefore, at time t2 and subsequent times in the boosting circuit 2, the outputs of the inverted clock signal CLKB and the clock signal CLK are stopped (a "Low" level signal is outputted) from the first and second AND circuits 2c and 2j of the boosting circuit 2 in synchronization with the clock signal CLK and the inverted clock signal CLKB (FIG. 2).

Thus the first and second capacitors 2b and 2i are not charged, so that at Node1 and Node2 of the boosting circuit 2, a voltage signal having the amplitude of VCC is outputted in response to the clock signal CLK and the inverted clock signal CLKB. Therefore, the voltage charged in the third and fourth capacitors 2o and 2p is reduced. In other words, the boosting circuit 2 has low boosting capability with a low boosting speed.

Next, at time t3, the output voltage Vout reaches the set voltage Vset or higher and the second detecting signal LIMIT2 ("High" level signal) is outputted. Thus the outputs of the clock signal CLK and the inverted clock signal CLKB from the clock signal generating circuit 4 are stopped.

Therefore, at time t3 and subsequent times, a voltage signal at the "Low" level (ground potential) is outputted at Node1 and Node2 of the boosting circuit 2, so that the third and fourth capacitors 2o and 2p are not charged. In other words, the boosting circuit 2 is deactivated.

Next, at time t4, the output voltage Vout falls below the set voltage Vset and a "Low" level signal is outputted from the first comparator amplifier 3b of the voltage detecting circuit 3. Thus the outputs of the clock signal CLK and the inverted clock signal CLKB from the clock signal generating circuit 4 are restarted.

Therefore, at time t4 and subsequent times, a voltage signal having the amplitude of VCC is outputted at Node1 and Node2 of the boosting circuit 2 in response to the clock signal CLK and the inverted clock signal CLKB. Therefore, the voltage charged in the third and fourth capacitors 2o and 2p is low. In other words, the boosting circuit 2 has low boosting capability with a low boosting speed.

When the output voltage Vout decreases, the first detecting signal LIMIT1 ("High" level signal) is not outputted from the voltage detecting circuit 3 at time t5 and the limit signal LIMIT is set at the "High" level.

Thus, in the boosting circuit 2, the inverted clock signal CLKB and the clock signal CLK are outputted from the first and second AND circuits 2c and 2j, respectively. Further, the voltage VCC is supplied to the first and second capacitors 2b and 2i from the first and fourth MOS transistors 2a and 2h. Thus, for example, the voltage VCC is charged in the first and second capacitors 2b and 2i (FIG. 2).

Therefore, at Node1 and Node 2 of the boosting circuit 2, a voltage signal having an amplitude of 2VCC is outputted in response to the clock signal CLK and the inverted clock signal CLKB. Therefore, a voltage charged in the third and fourth capacitors 2o and 2p increases. In other words, the boosting circuit 2 has high boosting capability with a high boosting speed.

The same operations are repeated thereafter.

In the above operations, from time t0 to time t1, the power supply circuit 100 operates with high boosting capability so as to increase the rising speed of the output voltage Vout to the set voltage Vset. From time t1 to t5, the power supply circuit 100 operates with low boosting capability so as to reduce fluctuations in the output voltage Vout.

The following will describe an example in which the power supply circuit 100 having the above configuration and function is applied to a NAND flash memory.

Figure 7:
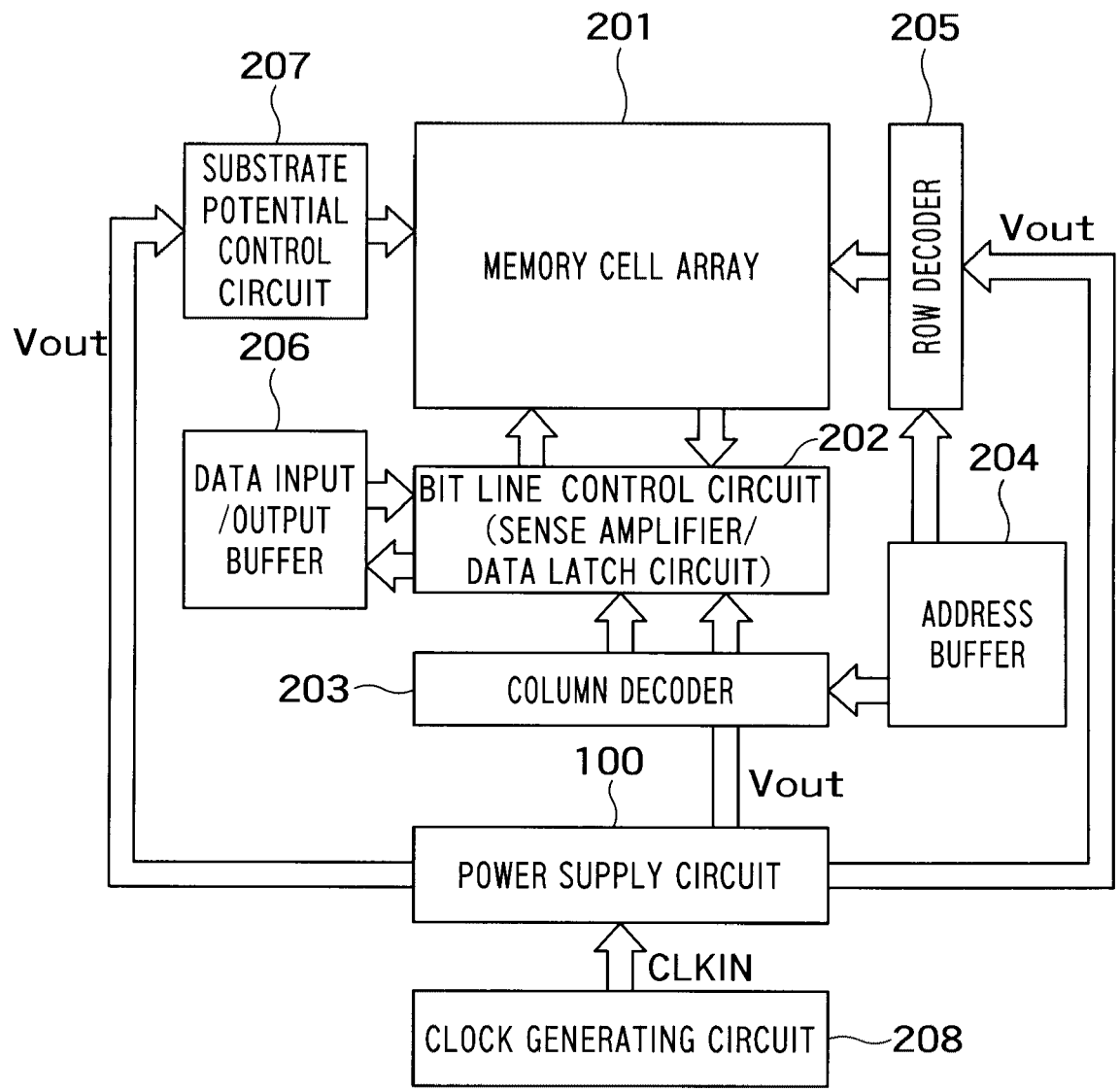
FIG. 7 is a block diagram showing an example of a NAND flash memory including the power supply circuit according to the first embodiment.

FIG. 7 is a block diagram showing an example of a NAND flash memory including the power supply circuit according to the first embodiment which is an aspect of the present invention.

As shown in FIG. 7, a semiconductor memory 200 which is a NAND flash memory includes a bit line control circuit 202 for writing and reading data on a memory cell array 201 serving as memory means.

The bit line control circuit 202 is connected to a data input/output buffer 206. Further, the bit line control circuit 202 is fed with the output of a column coder 203 as an input. The column coder 203 is fed with an address signal from an address buffer 204.

Further, the semiconductor memory 200 includes a row decoder 205 for controlling a control gate and a selector gate in the memory cell array 201, and a substrate voltage control circuit 207 for controlling the voltage of a p-type substrate (or a p-type well) on which the memory cell array 201 is formed.

Moreover, the semiconductor memory 200 includes a clock generating circuit 208 and the power supply circuit 100 of the present embodiment.

The power supply circuit 100 supplies an output voltage VPP to the bit line control circuit 202, the row decoder 205, and the substrate voltage control circuit 207 during reading, writing, and deletion of the memory cell array 201.

As described above, the power supply circuit 100 can supply the output voltage Vout to the circuit configuration with reduced fluctuations around the set voltage Vset.

For example, in a writing operation on the cells of a NAND flash memory, the semiconductor memory 200 configured thus can reduce ripples on the word lines of selected cells and unselected cells, the Vth distribution of written cells, and erroneous writing and the like on unselected cells.

As described above, the power supply circuit of the present embodiment can reduce fluctuations in output voltage while increasing the rising speed of the output voltage.

SECOND EMBODIMENT

The first embodiment described the configuration of the power supply circuit for reducing fluctuations in output voltage while increasing the rising speed of the output voltage.

The present embodiment will describe an example in which the configuration of a boosting circuit in such a power supply circuit is different from the boosting circuit of the first embodiment.

Figure 8:
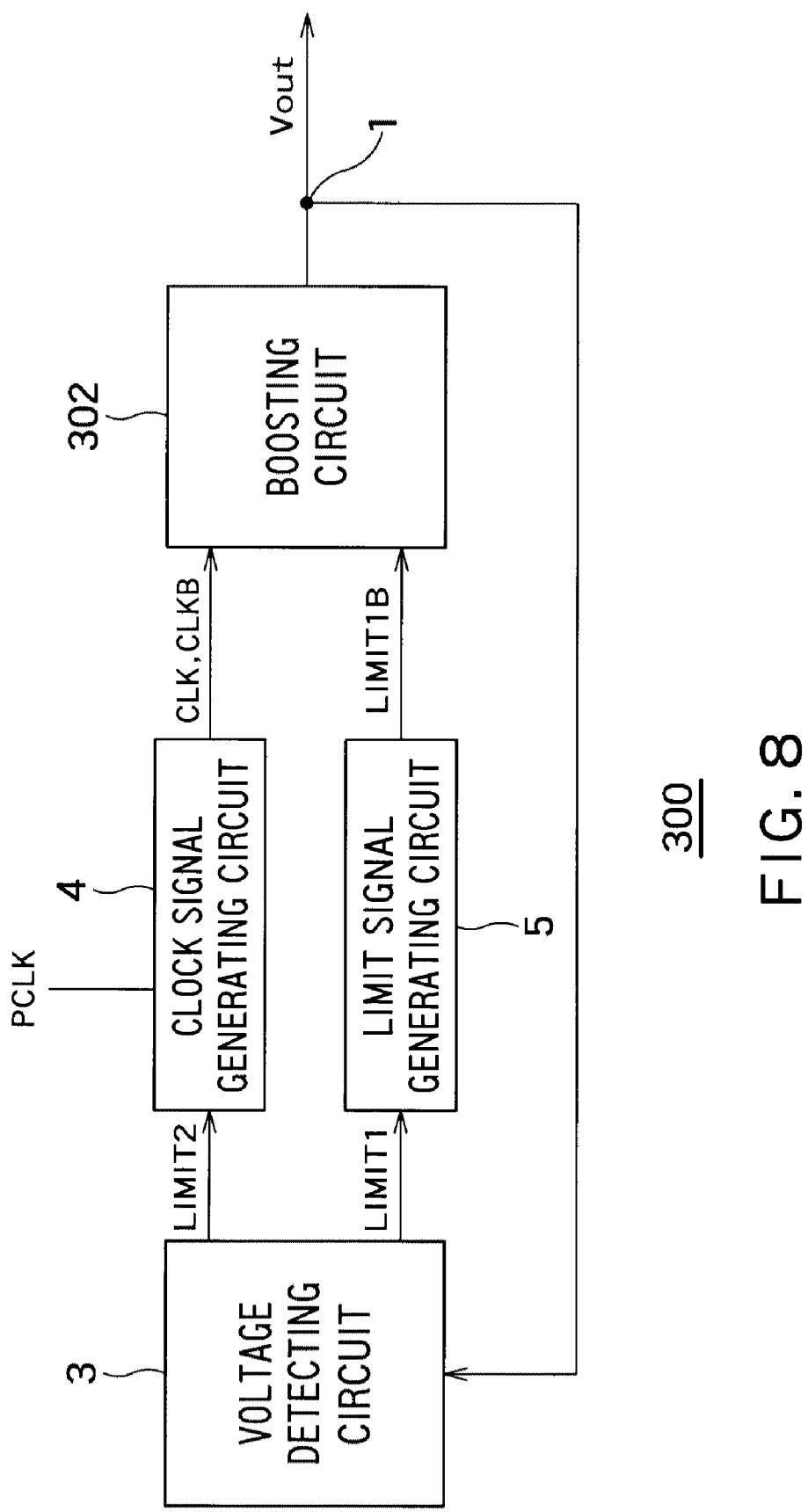
FIG. 8 shows the configuration of the main part of a power supply circuit 300 according to a second embodiment.
Figure 9:
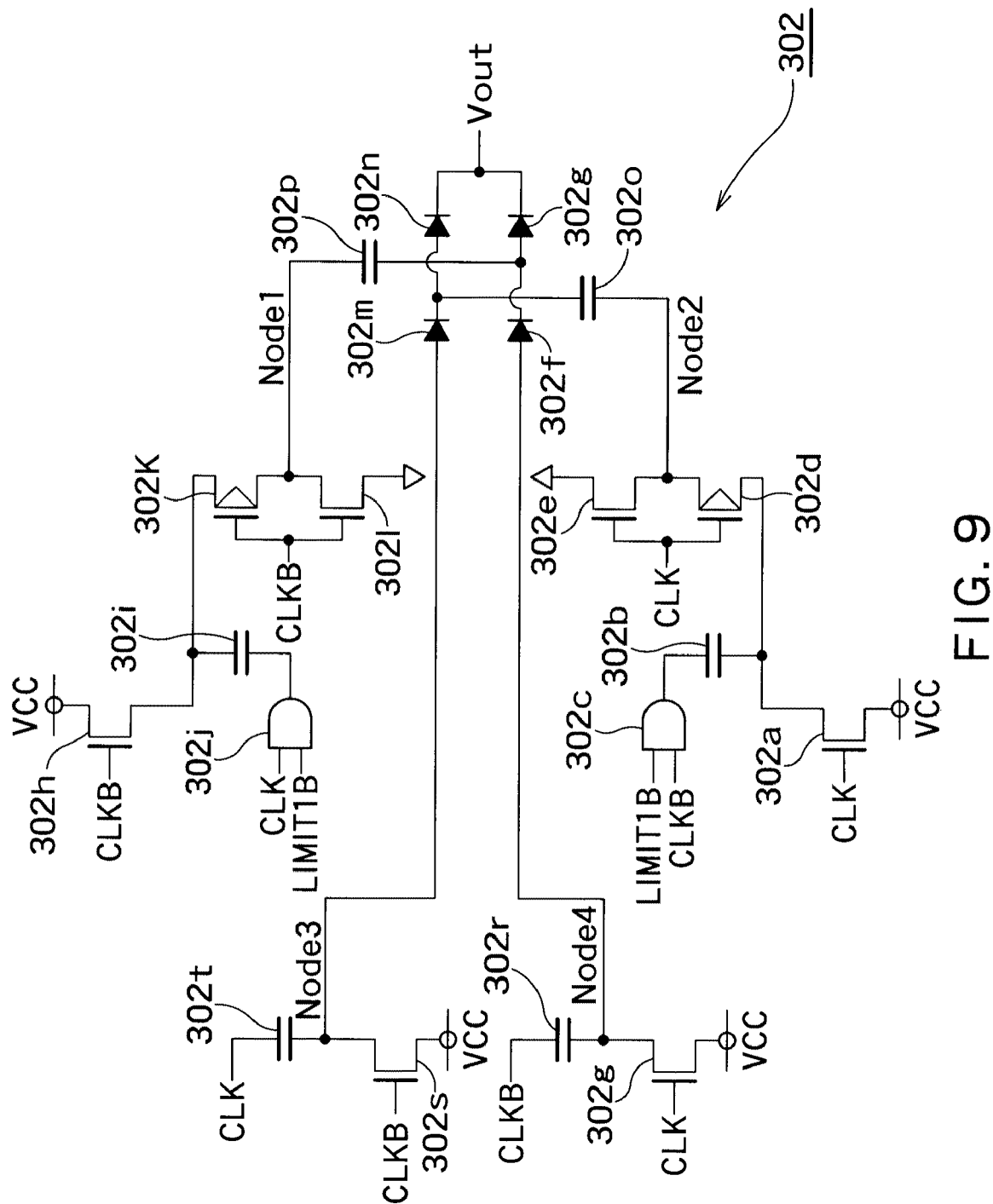
FIG. 9 shows an example of a boosting circuit applied to the power supply circuit of FIG. 8.

FIG. 8 shows the configuration of the main part of a power supply circuit 300 according to a second embodiment which is an aspect of the present invention. FIG. 9 shows an example of a boosting circuit applied to the power supply circuit of FIG. 8.

In the second embodiment, configurations indicated by the same reference numerals as the first embodiment are the same as the configurations of the first embodiment.

As shown in FIG. 8, the power supply circuit 300 controls an output voltage Vout from an output terminal 1 to a set voltage Vset and outputs the voltage.

The power supply circuit 300 includes a boosting circuit 302 which boosts a voltage supplied from a power supply and outputs the voltage to the output terminal 1, and a voltage detecting circuit 3 which detects the voltage Vout outputted from the boosting circuit 302, outputs a first detecting signal LIMIT1 for controlling the boosting capability of the boosting circuit 302 according to the detected voltage, and outputs a second detecting signal LIMIT2 for controlling the activation of the boosting circuit 302.

Further, the power supply circuit 300 includes a clock signal generating circuit 4 which outputs, based on a reference clock signal PCLK, a clock signal CLK and an inverted clock signal CLKB obtained by inverting the clock signal CLK, and stops the outputs of the clock signal CLK and the inverted clock signal CLKB in response to the second detecting signal LIMIT2, and a limit signal generating circuit 5 for outputting a limit signal LIMIT1B which is generated based on the first detecting signal LIMIT1 to limit the boosting capability.

The configuration of the power supply circuit 300 is identical to the power supply circuit 100 of the first embodiment other than the boosting circuit 302.

As shown in FIG. 9, the boosting circuit 302 includes a first MOS transistor 302a of a first conductivity type (n type) which has one end (drain) connected to a power supply VCC and the gate fed with the clock signal CLK, and a first capacitor 302b having one end connected to the other end (source) of the first MOS transistor 302a.

Further, the boosting circuit 302 includes a first AND circuit 302c acting as a first logic circuit which is fed with the limit signal LIMIT1B and the inverted clock signal CLKB, has the output connected to the other end of the first capacitor 302b, outputs the inverted clock signal CLKB to the other end of the first capacitor 302b, and limits the output of the inverted clock signal CLKB in response to the limit signal LIMIT1B.

For example, when the limit signal LIMIT1B is a "High" level signal, that is, in a logic "1" state, the first AND circuit 302c outputs the inputted inverted clock signal CLKB. On the other hand, when the limit signal LIMIT1B is a "Low" level signal, that is, in a logic "0" state, the first AND circuit 302c stops the output of the inverted clock signal CLKB and outputs a "Low" level signal (a signal at the ground potential).

Further, the boosting circuit 302 includes a second MOS transistor 302d of a second conductivity type (p type) which has one end (source) connected to the one end of the first capacitor 302b and the gate fed with the clock signal CLK, and a third MOS transistor 302e of the first conductivity type which has one end (drain) connected to the other end (drain) of the second MOS transistor 302d, the other end (source) connected to the ground, and the gate connected to the gate of the second MOS transistor 302d.

Moreover, the boosting circuit 302 includes a fourth MOS transistor 302h of the first conductivity type which has one end (drain) connected to the power supply VCC and the gate fed with the inverted clock signal CLKB, and a second capacitor 302i having one end connected to the other end (source) of the fourth MOS transistor 302h.

Further, the boosting circuit 302 includes a second AND circuit 302j acting as a second logic circuit which is fed with the limit signal LIMIT1B and the clock signal CLK, has the output connected to the other end of the second capacitor 302i, outputs the clock signal CLK to the other end of the second capacitor 302i, and limits the output of the clock signal CLK in response to the limit signal LIMIT1B.

For example, when the limit signal LIMIT1B is a "High" level signal, that is, in a logic "1" state, the second AND circuit 302j outputs the inputted clock signal CLK. On the other hand, when the limit signal LIMIT1B is a "Low" level signal, that is, in the logic "0" state, the second AND circuit 302j stops the output of the clock signal CLK and outputs a "Low" level signal (a signal at the ground potential).

Further, the boosting circuit 302 includes a fifth MOS transistor 302k of the second conductivity type which has one end (source) connected to the one end of the second capacitor 302i and the gate fed with the inverted clock signal CLKB, and a sixth MOS transistor 302l of the first conductivity type which has one end (drain) connected to the other end (drain) of the fifth MOS transistor 302k, the other end (source) connected to the ground, and the gate connected to the gate of the fifth MOS transistor 302k.

The other end (drain) of the second MOS transistor 302d will be referred to as Node2 and the other end (drain) of the fifth MOS transistor 302k will be referred to as Node1.

Further, the boosting circuit 302 includes a seventh MOS transistor 302q of the first conductivity type which has one end (drain) connected to the power supply VCC and the gate fed with the clock signal CLK, and a third capacitor 302r having one end connected to the other end (source) of the seventh MOS transistor 302q and the other end fed with the inverted clock signal CLKB.

Moreover, the boosting circuit 302 includes a first diode 302f having the anode connected to the other end (source) of the seventh MOS transistor 302g, and a second diode 302g having the anode connected to the cathode of the first diode 302f and the cathode connected to the output terminal 1.

Further, the boosting circuit 302 includes an eighth MOS transistor 302s of the first conductivity type which has one end (drain) connected to the power supply VCC and the gate fed with the inverted clock signal CLKB, and a fourth capacitor 302t having one end connected to the other end (source) of the eighth MOS transistor 302s and the other end fed with the clock signal CLK.

Moreover, the boosting circuit 302 includes a third diode 302m having the anode connected to the other end (source) of the eighth MOS transistor 302s, and a fourth diode 302n having the anode connected to the cathode of the third diode 302m and the cathode connected to the output terminal 1.

Further, the boosting circuit 302 includes a fifth capacitor 302o having one end connected to the other end (drain) of the second MOS transistor 302d and the other end connected to the cathode of the third diode 302m, and a sixth capacitor 302p having one end connected to the other end (drain) of the fifth MOS transistor 302k and the other end connected to the cathode of the first diode 302f.

The other end (source) of the seventh MOS transistor 302q will be referred to as Node4 and the other end (source) of the eighth MOS transistor 302s will be referred to as Node3.

As in the first embodiment, when the voltage Vout outputted from the boosting circuit 302 is not lower than a first detection voltage V1 set lower than the set voltage Vset, the voltage detecting circuit 3 outputs the first detecting signal LIMIT1. Further, as in the first embodiment, when the voltage Vout outputted from the boosting circuit 302 is not lower than the set voltage Vset, the voltage detecting circuit 3 outputs the second detecting signal LIMIT2.

The following will discuss the boosting operation of the power supply circuit 300 configured thus.

Figure 10:
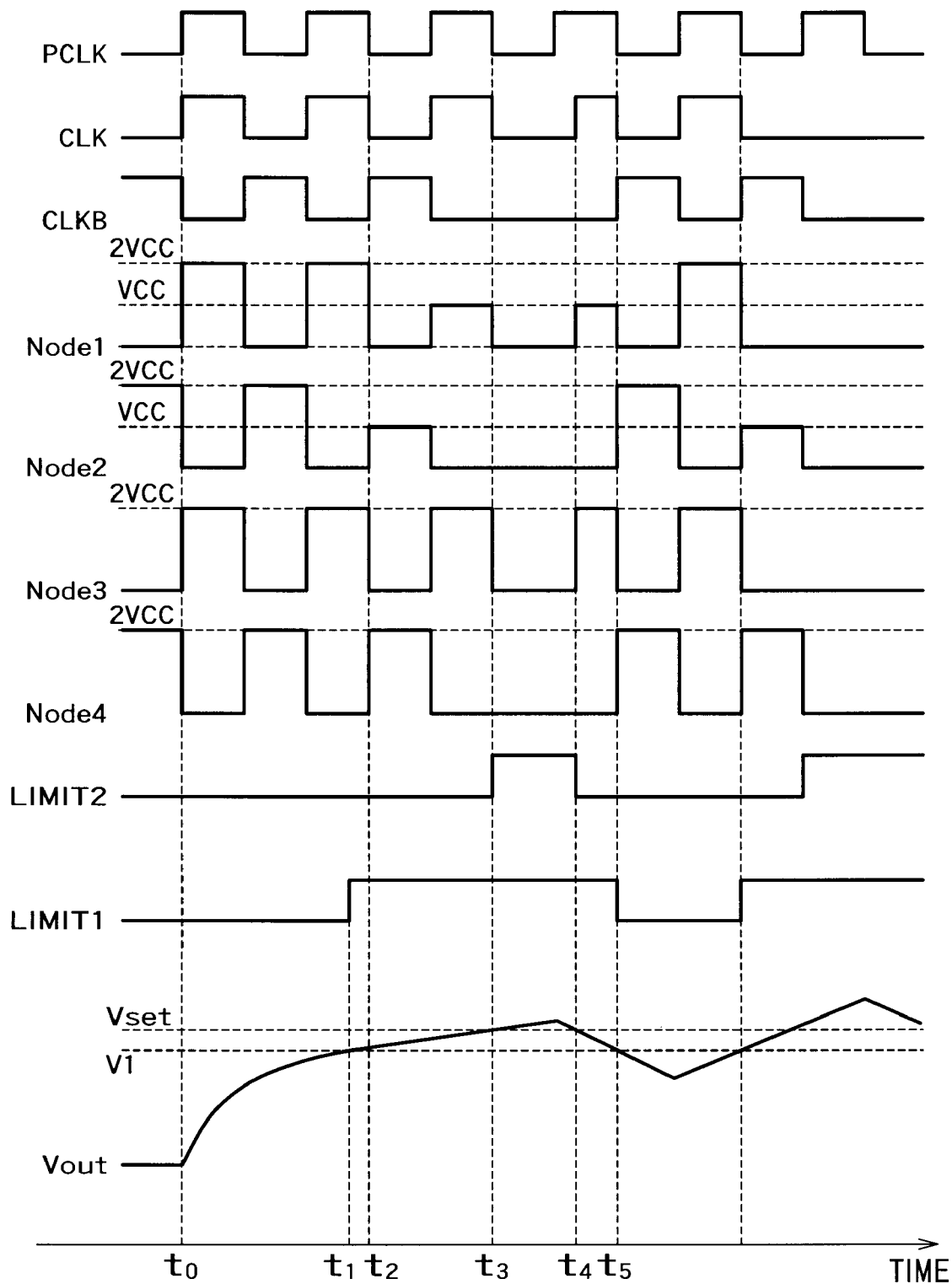
FIG. 10 shows the relationship between the output of the power supply circuit and the timing waveforms of the signals for controlling the boosting operation of the power supply circuit according to the second embodiment.

FIG. 10 shows the relationship between the output of the power supply circuit and the timing waveforms of the signals for controlling the boosting operation of the power supply circuit according to the second embodiment of the present invention.

As shown in FIG. 10, first, the boosting operation is started at time t0. At this time, the output voltage Vout is lower than the first detection voltage V1. Thus the first detecting signal LIMIT1 ("High" level signal) is not outputted from the voltage detecting circuit 3 and the limit signal LIMIT is at a "High" level.

Therefore, in the boosting circuit 302, the inverted clock signal CLKB and the clock signal CLK are outputted from the first and second AND circuits 302c and 302j, respectively. Further, a voltage VCC is supplied from the first and fourth MOS transistors 302a and 302h to the first and second capacitors 302b and 302i. Thus, for example, the voltage VCC is charged in the first and second capacitors 302b and 302i. Moreover, a voltage signal having an amplitude of 2VCC is outputted to Node3 and Node4 in synchronization with the inverted clock signal CLKB and the clock signal CLK.

Thus, at Node1 and Node2 of the boosting circuit 302, the voltage signal having the amplitude of 2VCC is outputted in response to the clock signal CLK and the inverted clock signal CLKB. Therefore, a voltage charged in the fifth and sixth capacitors 302o and 302p increases. In other words, the boosting circuit 302 has high boosting capability with a high boosting speed.

Next, at time t1, the output voltage Vout reaches the first detection voltage V1 or higher and the first detecting signal LIMIT1 ("High" level signal) is outputted. Thus the limit signal LIMIT is set at a "Low" level.

Thus, at time t2 and subsequent times in the boosting circuit 302, the outputs of the inverted clock signal CLKB and the clock signal CLK are stopped (a "Low" level signal is outputted) from the first and second AND circuits 302c and 302j of the boosting circuit 302 in synchronization with the clock signal CLK and the inverted clock signal CLKB (FIG. 2).

Therefore, the first and second capacitors 302b and 302i are not charged, so that at Node1 and Node2 of the boosting circuit 302, a voltage signal having the amplitude of VCC is outputted in response to the clock signal CLK and the inverted clock signal CLKB. Thus the voltage charged in the fifth and sixth capacitors 302o and 302p is reduced. In other words, the boosting circuit 302 has low boosting capability with a low boosting speed.

Next, at time t3, the output voltage Vout reaches the set voltage Vset or higher and the second detecting signal LIMIT2 ("High" level signal) is outputted. Thus the outputs of the clock signal CLK and the inverted clock signal CLKB from the clock signal generating circuit 4 are stopped.

Therefore, at time t3 and subsequent times, a voltage signal at a "Low" level (ground potential) is outputted at Node1 and Node2 of the boosting circuit 302 and a voltage signal at a "Low" level (ground potential) is similarly outputted at Node3 and Node 4 of the boosting circuit 302, so that the fifth and sixth capacitors 302o and 302p are not charged. In other words, the boosting circuit 302 is deactivated.

Next, at time t4, the output voltage Vout falls below the set voltage Vset and a "Low" level signal is outputted from the first comparator amplifier 3b of the voltage detecting circuit 3. Thus the outputs of the clock signal CLK and the inverted clock signal CLKB from the clock signal generating circuit 4 are restarted.

Therefore, at time t4 and subsequent times, a voltage signal having the amplitude of VCC is outputted at Node1 and Node2 of the boosting circuit 302 in response to the clock signal CLK and the inverted clock signal CLKB. Therefore, the voltage charged in the fifth and sixth capacitors 302o and 302p is low. In other words, the boosting circuit 302 has low boosting capability with a low boosting speed.

When the output voltage Vout decreases, the first detecting signal LIMIT1 ("High" level signal) is not outputted from the voltage detecting circuit 3 at time t5 and the limit signal LIMIT is set at the "High" level.

Thus, in the boosting circuit 302, the inverted clock signal CLKB and the clock signal CLK are outputted from the first and second AND circuits 302c and 302j, respectively. Further, the voltage VCC is supplied to the first and second capacitors 302b and 302i from the first and fourth MOS transistors 302a and 302h. Thus, for example, the voltage VCC is charged in the first and second capacitors 302b and 302i. Moreover, the voltage signal having the amplitude of 2VCC is outputted to Node3 and Node4 in synchronization with the inverted clock signal CLKB and the clock signal CLK (FIG. 9).

Therefore, at Node1 and Node2 of the boosting circuit 302, the voltage signal having the amplitude of 2VCC is outputted in response to the clock signal CLK and the inverted clock signal CLKB. Therefore, a voltage charged in the third and fourth capacitors 2o and 2p increases. In other words, the boosting circuit 302 has high boosting capability with a high boosting speed.

The same operations are repeated thereafter.

In the above operations, from time t0 to time t1, the power supply circuit 300 operates with high boosting capability so as to increase the rising speed of the output voltage Vout to the set voltage Vset.

From time t1 to t5, the power supply circuit 300 operates with low boosting capability so as to reduce fluctuations in the output voltage Vout.

As described above, the power supply circuit of the present embodiment can reduce fluctuations in output voltage while increasing the rising speed of the output voltage.

Like the power supply circuit 100 of the first embodiment, the power supply circuit 300 of the second embodiment is applicable to the semiconductor memory 200 which is a NAND flash memory shown in FIG. 7

What is claimed is:

1. A power supply circuit that outputs a set voltage from an output terminal, comprising:
   a boosting circuit that boosts a voltage supplied from a power supply and outputs the voltage to the output terminal;
   a voltage detecting circuit that outputs a first detecting signal when the voltage outputted from the boosting circuit is not lower than a first detection voltage set lower than the set voltage, and outputs a second detecting signal when the voltage outputted from the boosting circuit is not lower than the set voltage; and
   a clock signal generating circuit that outputs, based on a reference clock signal, a clock signal and an inverted clock signal obtained by inverting the clock signal, and stops outputs of the clock signal and the inverted clock signal in response to the second detecting signal,
   the boosting circuit comprising:
   a first MOS transistor of a first conductivity type having one end connected to the power supply and a gate fed with the clock signal;
   a first capacitor having one end connected to an other end of the first MOS transistor;
   a first logic circuit fed with the inverted clock signal and a limit signal generated based on the first detecting signal to limit a boosting capability, outputting the inverted clock signal to an other end of the first capacitor, and limiting the output of the inverted clock signal in response to the limit signal;

a second MOS transistor of a second conductivity type having one end connected to the one end of the first capacitor and a gate fed with the clock signal;

a third MOS transistor of the first conductivity type having one end connected to an other end of the second MOS transistor, an other end connected to ground, and a gate connected to the gate of the second MOS transistor;

a fourth MOS transistor of the first conductivity type having one end connected to the power supply and a gate fed with the inverted clock signal;

a second capacitor having one end connected to an other end of the fourth MOS transistor;

a second logic circuit fed with the limit signal and the clock signal, outputting the clock signal to an other end of the second capacitor, and limiting the output of the clock signal in response to the limit signal;

a fifth MOS transistor of the second conductivity type having one end connected to the one end of the second capacitor and a gate fed with the inverted clock signal;

a sixth MOS transistor of the first conductivity type having one end connected to an other end of the fifth MOS transistor, an other end connected to the ground, and a gate connected to the gate of the fifth MOS transistor;

a first diode having an anode connected to the one end of the second MOS transistor;

a second diode having an anode connected to a cathode of the first diode and a cathode connected to the output terminal;

a third diode having an anode connected to the one end of the fifth MOS transistor;

a fourth diode having an anode connected to a cathode of the third diode and a cathode connected to the output terminal;

a third capacitor having one end connected to the other end of the second MOS transistor and an other end connected to the cathode of the third diode; and a fourth capacitor having one end connected to the other end of the fifth MOS transistor and an other end connected to the cathode of the first diode.

2. The power supply circuit according to claim 1, wherein the voltage detecting circuit comprises:

a voltage dividing circuit that divides the voltage outputted from the boosting circuit at a first voltage dividing ratio and outputs a first monitor voltage, the voltage dividing circuit further divides the voltage outputted from the boosting circuit at a second voltage dividing ratio smaller than the first voltage dividing ratio and outputs a second monitor voltage;

a first comparator amplifier that compares the first monitor voltage and a reference voltage and outputs the first detecting signal when the first monitor voltage is higher than the reference voltage; and a second comparator amplifier that compares the second monitor voltage and the reference voltage and outputs the second detecting signal when the second monitor voltage is higher than the reference voltage.

3. The power supply circuit according to claim 2, wherein the first logic circuit is a first AND circuit having an output connected to the other end of the first capacitor, and the second logic circuit is a second AND circuit having an output connected to the other end of the second capacitor.

4. The power supply circuit according to claim 1, wherein the first logic circuit is a first AND circuit having an output connected to the other end of the first capacitor, and the second logic circuit is a second AND circuit having an output connected to the other end of the second capacitor.

5. A power supply circuit that outputs a set voltage from an output terminal, comprising:

a boosting circuit that boosts a voltage supplied from a power supply and outputs the voltage to the output terminal;

a voltage detecting circuit that outputs a first detecting signal when the voltage outputted from the boosting circuit is not lower than a first detection voltage set lower than the set voltage, and outputs a second detecting signal when the voltage outputted from the boosting circuit is not lower than the set voltage; and a clock signal generating circuit that outputs, based on a reference clock signal, a clock signal and an inverted clock signal obtained by inverting the clock signal, and stops outputs of the clock signal and the inverted clock signal in response to the second detecting signal, the boosting circuit comprising:

a first MOS transistor of a first conductivity type having one end connected to the power supply and a gate fed with the clock signal;

a first capacitor having one end connected to an other end of the first MOS transistor;

a first logic circuit fed with the inverted clock signal and a limit signal generated based on the first detecting signal to limit a boosting capability, outputting the inverted clock signal to an other end of the first capacitor, and limiting the output of the inverted clock signal in response to the limit signal;

a second MOS transistor of a second conductivity type having one end connected to the one end of the first capacitor and a gate fed with the clock signal;

a third MOS transistor of the first conductivity type having one end connected to an other end of the second MOS transistor, an other end connected to ground, and a gate connected to the gate of the second MOS transistor;

a fourth MOS transistor of the first conductivity type having one end connected to the power supply and a gate fed with the inverted clock signal;

a second capacitor having one end connected to an other end of the fourth MOS transistor;

a second logic circuit fed with the limit signal and the clock signal, outputting the clock signal to an other end of the second capacitor, and limiting the output of the clock signal in response to the limit signal;

a fifth MOS transistor of the second conductivity type having one end connected to the one end of the second capacitor and a gate fed with the inverted clock signal;

a sixth MOS transistor of the first conductivity type having one end connected to an other end of the fifth MOS transistor, an other end connected to the ground, and a gate connected to the gate of the fifth MOS transistor;

a seventh MOS transistor of the first conductivity type having one end connected to the power supply and a gate fed with the clock signal;

a third capacitor having one end connected to the other end of the seventh MOS transistor and an other end fed with the inverted clock signal;

a first diode having an anode connected to the other end of the seventh MOS transistor;

a second diode having an anode connected to a cathode of the first diode and a cathode connected to the output terminal;

an eighth MOS transistor of the first conductivity type having one end connected to the power supply and a gate fed with the inverted clock signal;

a fourth capacitor having one end connected to the other end of the eighth MOS transistor and an other end fed with the clock signal;

a third diode having an anode connected to the other end of the eighth MOS transistor;

a fourth diode having an anode connected to a cathode of the third diode and a cathode connected to the output terminal;

a fifth capacitor having one end connected to the other end of the second MOS transistor and an other end connected to the cathode of the third diode; and a sixth capacitor having one end connected to the other end of the fifth MOS transistor and an other end connected to the cathode of the first diode.

6. The power supply circuit according to claim 5, wherein the voltage detecting circuit comprises:

a voltage dividing circuit that divides the voltage outputted from the boosting circuit at a first voltage dividing ratio and outputs a first monitor voltage, the voltage dividing circuit further divides the voltage outputted from the boosting circuit at a second voltage dividing ratio smaller than the first voltage dividing ratio and outputs a second monitor voltage;

a first comparator amplifier that compares the first monitor voltage and a reference voltage and outputs the first detecting signal when the first monitor voltage is higher than the reference voltage; and a second comparator amplifier that compares the second monitor voltage and the reference voltage and outputs the second detecting signal when the second monitor voltage is higher than the reference voltage.

7. The power supply circuit according to claim 6, wherein the first logic circuit is a first AND circuit having an output connected to the other end of the first capacitor, and the second logic circuit is a second AND circuit having an output connected to the other end of the second capacitor.

8. The power supply circuit according to claim 5, wherein the first logic circuit is a first AND circuit having an output connected to the other end of the first capacitor, and the second logic circuit is a second AND circuit having an output connected to the other end of the second capacitor.

9. A semiconductor memory comprising a power supply circuit that outputs a set voltage from an output terminal, the power supply circuit comprising:

a boosting circuit that boosts a voltage supplied from a power supply and outputs the voltage to the output terminal;

a voltage detecting circuit that outputs a first detecting signal when the voltage outputted from the boosting circuit is not lower than a first detection voltage set lower than the set voltage, and outputs a second detecting signal when the voltage outputted from the boosting circuit is not lower than the set voltage; and a clock signal generating circuit that outputs, based on a reference clock signal, a clock signal and an inverted clock signal obtained by inverting the clock signal, and stops outputs of the clock signal and the inverted clock signal in response to the second detecting signal, the boosting circuit comprising:

a first MOS transistor of a first conductivity type having one end connected to the power supply and a gate fed with the clock signal;

a first capacitor having one end connected to an other end of the first MOS transistor;

a first logic circuit fed with the inverted clock signal and a limit signal generated based on the first detecting signal to limit a boosting capability, outputting the inverted clock signal to an other end of the first capacitor, and limiting the output of the inverted clock signal in response to the limit signal;

a second MOS transistor of a second conductivity type having one end connected to the one end of the first capacitor and a gate fed with the clock signal;

a third MOS transistor of the first conductivity type having one end connected to an other end of the second MOS transistor, an other end connected to ground, and a gate connected to the gate of the second MOS transistor;

a fourth MOS transistor of the first conductivity type having one end connected to the power supply and a gate fed with the inverted clock signal;

a second capacitor having one end connected to an other end of the fourth MOS transistor;

a second logic circuit fed with the limit signal and the clock signal, outputting the clock signal to an other end of the second capacitor, and limiting the output of the clock signal in response to the limit signal;

a fifth MOS transistor of the second conductivity type having one end connected to the one end of the second capacitor and a gate fed with the inverted clock signal;

a sixth MOS transistor of the first conductivity type having one end connected to an other end of the fifth MOS transistor, an other end connected to the ground, and a gate connected to the gate of the fifth MOS transistor;

a first diode having an anode connected to the one end of the second MOS transistor;

a second diode having an anode connected to a cathode of the first diode and a cathode connected to the output terminal;

a third diode having an anode connected to the one end of the fifth MOS transistor;

a fourth diode having an anode connected to a cathode of the third diode and a cathode connected to the output terminal;

a third capacitor having one end connected to the other end of the second MOS transistor and an other end connected to the cathode of the third diode; and a fourth capacitor having one end connected to the other end of the fifth MOS transistor and an other end connected to the cathode of the first diode.

10. The semiconductor memory according to claim 9, wherein the voltage detecting circuit comprises:

a voltage dividing circuit that divides the voltage outputted from the boosting circuit at a first voltage dividing ratio and outputs a first monitor voltage, the voltage dividing circuit further divides the voltage outputted from the boosting circuit at a second voltage dividing ratio smaller than the first voltage dividing ratio and outputs a second monitor voltage;

a first comparator amplifier that compares the first monitor voltage and a reference voltage and outputs the first detecting signal when the first monitor voltage is higher than the reference voltage; and a second comparator amplifier that compares the second monitor voltage and the reference voltage and outputs the second detecting signal when the second monitor voltage is higher than the reference voltage.

11. The semiconductor memory according to claim 10, wherein the first logic circuit is a first AND circuit having an output connected to the other end of the first capacitor, and the second logic circuit is a second AND circuit having an output connected to the other end of the second capacitor.

12. The semiconductor memory according to claim 11, wherein the semiconductor memory is a NAND flash memory.

13. The semiconductor memory according to claim 10, wherein the semiconductor memory is a NAND flash memory.

14. The semiconductor memory according to claim 9, wherein the first logic circuit is a first AND circuit having an output connected to the other end of the first capacitor, and the second logic circuit is a second AND circuit having an output connected to the other end of the second capacitor.

15. The semiconductor memory according to claim 14, wherein the semiconductor memory is a NAND flash memory.

16. The semiconductor memory according to claim 9, wherein the semiconductor memory is a NAND flash memory.

* * * * *